United States Patent
Wang et al.

(10) Patent No.: US 11,417,716 B2
(45) Date of Patent: Aug. 16, 2022

(54) ORGANIC LIGHT EMITTING DISPLAY SUBSTRATE AND PANEL WITH PHOTODETECTOR FOR LIGHT COMPENSATION OF SUBPIXEL

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 300 days.

(21) Appl. No.: 16/617,788

(22) PCT Filed: Jun. 5, 2019

(86) PCT No.: PCT/CN2019/090129
§ 371 (c)(1),
(2) Date: Nov. 27, 2019

(87) PCT Pub. No.: WO2020/019881
PCT Pub. Date: Jan. 30, 2020

(65) Prior Publication Data
US 2021/0359061 A1    Nov. 18, 2021

(30) Foreign Application Priority Data
Jul. 26, 2018   (CN) ......................... 201810837242.4

(51) Int. Cl.
*H01L 27/32*     (2006.01)
*H01L 51/52*     (2006.01)
*H01L 51/56*     (2006.01)

(52) U.S. Cl.
CPC ........ *H01L 27/3269* (2013.01); *H01L 27/322* (2013.01); *H01L 51/5228* (2013.01);
(Continued)

(58) Field of Classification Search
CPC ............... H01L 27/3269; H01L 27/322; H01L 2227/323; H01L 27/3251; H01L 27/3227;
(Continued)

(56) References Cited

U.S. PATENT DOCUMENTS

2002/0180902 A1   12/2002   Izumi et al.
2004/0170927 A1    9/2004   Pichler
(Continued)

FOREIGN PATENT DOCUMENTS

CN   103730533 A   4/2014
CN   105070738 A   11/2015
(Continued)

OTHER PUBLICATIONS

Office Action dated Mar. 31, 2020, issued in counterpart Application No. 201810837242.4, with English translation (17 pages).
(Continued)

*Primary Examiner* — Ermias T Woldegeorgis
(74) *Attorney, Agent, or Firm* — WHDA, LLP

(57) ABSTRACT

A display substrate includes a substrate (10) that is divided into a plurality of subpixel areas, a drive transistor (20) and a photodetector (30) in each of the plurality of subpixel areas, and an insulation layer (40) on the photodetector (30). The drive transistor (20) includes an electrode layer that includes a source electrode (21) and a drain electrode (22). The photodetector (30) is coupled to one of the source electrode (21) and the drain electrode (22). An entirety of an orthographic projection of the insulation layer (40) on the substrate is inside an orthographic projection of the electrode layer on the substrate (10).

20 Claims, 14 Drawing Sheets

(52) U.S. Cl.
CPC .......... *H01L 51/5284* (2013.01); *H01L 51/56* (2013.01); *H01L 2227/323* (2013.01); *H01L 2251/533* (2013.01)

(58) Field of Classification Search
CPC ............. H01L 27/3241; H01L 27/3262; H01L 51/5228; H01L 51/5284; H01L 51/56; H01L 2251/533
See application file for complete search history.

(56) References Cited

U.S. PATENT DOCUMENTS

| | | | |
|---|---|---|---|
| 2007/0188085 A1* | 8/2007 | Young | H01L 27/3272 313/506 |
| 2016/0218156 A1 | 7/2016 | Shedletsky et al. | |
| 2018/0040673 A1 | 2/2018 | Zeng et al. | |
| 2018/0053032 A1 | 2/2018 | Ding et al. | |

FOREIGN PATENT DOCUMENTS

| | | | | |
|---|---|---|---|---|
| CN | 107316884 A | | 11/2017 | |
| CN | 107342308 A | | 11/2017 | |
| CN | 107425038 A | * | 12/2017 | ......... H01L 27/3234 |
| CN | 107425038 A | | 12/2017 | |
| CN | 108230997 A | | 6/2018 | |
| CN | 108878503 A | | 11/2018 | |
| WO | WO-2005091262 A1 | * | 9/2005 | ......... H01L 27/1214 |
| WO | WO-2005093838 A1 | * | 10/2005 | ......... H01L 51/5203 |

OTHER PUBLICATIONS

International Search Report dated Aug. 27, 2019, issued in counterpart Application No. PCT/CN2019/090129 (5 pages).

* cited by examiner

ORGANIC LIGHT EMITTING DISPLAY SUBSTRATE AND PANEL WITH PHOTODETECTOR FOR LIGHT COMPENSATION OF SUBPIXEL

CROSS-REFERENCE TO RELATED APPLICATIONS

This application claims benefit of the filing date of Chinese Patent Application No. 201810837242.4 filed on Jul. 26, 2018, the disclosure of which is hereby incorporated in its entirety by reference.

TECHNICAL FIELD

The present disclosure generally relates to display technologies, and in particular, to an organic light emitting diode (OLED) display substrate and a method of fabricating the display substrate, a display panel containing the display substrate, and a display device containing the display panel.

BACKGROUND

Currently, the display technologies mainly include two main categories: organic light emitting diode (OLED) technology and liquid crystal display (LCD) technology. OLED is an organic thin film electroluminescent display device, and has numerous advantages that contribute to their popularity in the field of display technology. For example, OLED devices are self-illuminating, and are capable of high luminance, high contrast, simple construction, low power consumption and high energy efficiency, wide viewing angles, flexible display, and three-dimensional (3D) display. These advantages combine to make OLED a focus in the developments of display technologies.

BRIEF SUMMARY

The present disclosure provides a display substrate. The display substrate may comprise a substrate that is divided into a plurality of subpixel areas, a drive transistor and a photodetector in each of the plurality of subpixel areas, and an insulation layer on the photodetector. The drive transistor may comprise an electrode layer comprising a source electrode and a drain electrode. The photodetector may be coupled to one of the source electrode and the drain electrode. An entirety of an orthographic projection of the insulation layer on the substrate may be inside an orthographic projection of the electrode layer on the substrate.

In at least some embodiments, the insulation layer may be in contact with each of the photodetector, the source electrode, and the drain electrode.

In at least some embodiments, the insulation layer may cover an entirety of a surface of the source electrode opposite from the substrate, and an entirety of a surface of the drain electrode opposite from the substrate.

In at least some embodiments, the photodetector may comprise a semiconductor layer on the substrate, and a protective layer on the semiconductor layer.

In at least some embodiments, an entirety of the orthographic projection of the semiconductor layer on the substrate may be inside the orthographic projection of the protective layer on the substrate.

In at least some embodiments, the insulation layer may comprise at least one first through-hole.

In at least some embodiments, the display substrate may further comprise a coupling electrode on the insulation layer, the coupling electrode being configured to couple the photodetector to an external circuit.

In at least some embodiments, the coupling electrode may be coupled to the photodetector via the at least one first through-hole of the insulation layer.

In at least some embodiments, the display substrate may further comprise a passivation layer between the insulation layer and the coupling electrode.

In at least some embodiments, the passivation layer may comprise at least one second through-hole.

In at least some embodiments, the coupling electrode is coupled to the photodetector via the at least one first through-hole and the at least one second through-hole of the passivation layer.

In at least some embodiments, each of the coupling electrode and the protective layer may be composed of a transparent conductive material.

The present disclosure also provides a display panel. The display panel may comprise a cover panel and a back panel. One of the cover panel and the back panel may comprise a display substrate as described above.

In at least some embodiments, the cover panel may comprise a display substrate as described above, a black matrix layer on the drive transistor of the display substrate, a color filter layer on the photodetector of the display substrate, a support on the black matrix layer, and a second auxiliary cathode on the support. The back panel may comprise an anode, an organic light emitting layer on the anode, and a cathode on the organic light emitting layer. The cathode of the back panel may be joined to the second auxiliary cathode of the cover panel, so as to join the back panel to the cover panel.

In at least some embodiments, an entirety of an orthographic projection of the photodetector on the substrate may be inside an orthographic projection of the color filter layer on the substrate.

In at least some embodiments, the cover panel may further comprise a first auxiliary cathode between the black matrix layer and the support. In at least some embodiments, the first auxiliary cathode may be electrically coupled to the second auxiliary cathode. In at least some embodiments, the first auxiliary cathode may be composed of a metal. In at least some embodiments, the second auxiliary cathode is composed of a transparent conductive material.

In at least some embodiments, the cathode of the back panel may be composed of a same or different transparent conductive material from the second auxiliary cathode.

In at least some embodiments, the back panel may comprise a display substrate as described above, a color filter layer on the display substrate, an anode and an organic light emitting on the color filter layer, and a cathode on the organic light emitting layer. In at least some embodiments, the cathode joins the back panel to the cover panel.

In at least some embodiments, an entirety of an orthographic projection of the photodetector on the substrate may be inside an orthographic projection of the color filter layer on the substrate.

In at least some embodiments, the anode may be composed of a transparent conductive material. In at least some embodiments, the cathode may be composed of a reflective material.

The present disclosure also provides a display device. The display device may comprise a display panel as described above.

The present disclosure also provides a method of fabricating a display substrate. The method may comprise forming a layer of electrode layer forming material on a substrate;

forming a photodetector on the electrode forming layer; forming a layer of insulation layer forming material on the photodetector and the layer of electrode layer forming material; and performing a single patterning step to obtain an insulation layer and an electrode layer comprising a source electrode and a drain electrode. An entirety of an orthographic projection of the insulation layer on the substrate may be within an orthographic projection of the electrode layer on the substrate.

In at least some embodiments, the forming of the photodetector may comprise forming a semiconductor layer and a protective layer on the layer of electrode layer forming material.

In at least some embodiments, the method may further comprise, before the forming of the layer of electrode layer forming material, forming a light-shielding layer on the substrate; forming a buffer layer on the light-shielding layer; and forming an active layer on the buffer layer, a gate insulation layer on the active layer, a gate electrode on the gate insulation layer, and a dielectric layer on the gate electrode. An entirety of an orthographic projection of the active layer on the substrate may be inside an orthographic projection of the light shielding layer on the substrate.

In at least some embodiments, the layer of electrode layer forming material may be formed on the dielectric layer.

In at least some embodiments, the method may further comprise forming a passivation layer on the insulation layer. In at least some embodiments, each of insulation layer and the passivation layer may be formed with at least one through-hole.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1:
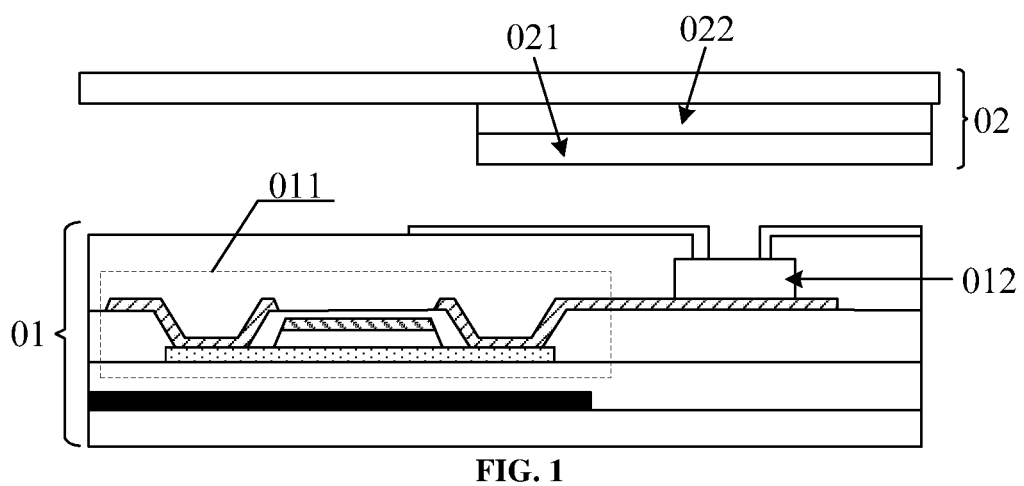
FIG. 1 shows a schematic diagram of a conventional OLED display panel.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

Currently, the display technologies mainly include two main categories: organic light emitting diode (OLED) technology and liquid crystal display (LCD) technology. OLED is an organic thin film electroluminescent display device, and has numerous advantages that contribute to their popularity in the field of display technology. For example, OLED devices are self-illuminating, and are capable of high luminance, high contrast, simple construction, low power consumption and high energy efficiency, wide viewing angles, flexible display, and three-dimensional (3D) display. These advantages combine to make OLED a focus in the developments of display technologies.

Conventional organic light emitting diode (OLED) display devices often suffer from issues affecting stability and/or uniformity of display. As the size of the display device grows, defects in display can become more noticeable. Thin film transistors (TFT) commonly implemented in display devices, including OLED devices. Several TFTs are usually implemented to drive the pixel circuit.

OLED displays are often required to provide high contrast and high brightness for a prolonged period of time, causing non-uniform degradation in the optical performances (for example, luminance) of the organic light emitting layers in the pixel units of the OLED display panel. Compensation must therefore be provided to the pixel units of the OLED display panel.

Conventional technologies rely mainly on electrical compensation, for example, via a compensation circuit. Generally there are two types of electrical compensation: internal compensation and external compensation. Some forms of compensation utilize a combination of internal and external compensations. In internal compensation, before the light emitting layer emits lights, a capacitor is configured to apply a compensation for the threshold voltage and mobility of the TFTs. However, the range of compensation tends to be small. Further, electrical compensation can only compensate for mura caused by shifts in the threshold voltage and mobility of the TFTs. However, electrical compensation cannot compensate for shifts and fluctuations in other aspects of the OLED device, for example, in the electroluminescent (EL) material of the OLED device due to aging. In addition, conventional practices are to perform a single optical compensation on the pixel units before the OLED display panel leaves the manufacturing facility, but once the OLED display panel leaves the manufacturing facility, optical compensation can no longer be performed on the pixel units.

Further, a common practice during conventional processes for fabricating a display panel with built-in compensation is to form the TFTs before forming the photodetectors. However, during patterning of the TFTs, the etching solution may damage the photodetectors, which may in turn compromise the functionality of the photodetectors in providing compensation to the pixel units. This can negatively affect the display effects of the display panel.

On the other hand, if the TFTs are formed before the photodetectors, then a substantial amount of hydrogen may be released during the formation of the photodetectors. The material for forming the photodetectors often contains a large amount of hydrogen. The released hydrogen may contaminate the TFTs. This can similarly affect the functionality of the photodetectors.

FIG. 1 shows a schematic diagram of a conventional OLED display panel. The display panel includes a first panel 01 and a second panel 02. The first panel 01 usually forms the cover panel, and defines a plurality of first subpixel areas. Each of the plurality of first subpixel areas is provided with a light compensation drive thin film transistor (TFT) 011 configured to perform light compensation, and a photodetector 012. The drive transistor 011 and the photodetector 012 are each electrically coupled to the light compensation integrated circuit (IC) (not shown). The light compensation integrated circuit is provided outside of the display panel.

The second panel 02 usually forms the back panel, and defines a plurality of second subpixel areas corresponding to the plurality of first subpixel areas. Each of the plurality of second subpixel areas is provided with an organic light emitting layer 021 and a drive circuit 022. The organic light emitting layer 021 is configured to emit light toward the first panel 01. The drive circuit 022 is configured to control the emission of light by the organic light emitting layer 021.

When the organic light emitting layer 021 in a particular subpixel area is emitting light, the corresponding photodetector 012 is configured to detect the light emission intensity of the organic light emitting layer 021, and to produce a leakage current corresponding to the detected light emission intensity. The photodetector 012 is further configured to transmit the leakage current to the light compensation IC via the drive transistor 011. The light compensation IC is configured to determine the light emission intensity of the organic light emitting layer 021 based on the received leakage current, and then apply an appropriate adjustment to the light emission intensity of the organic light emitting layer 021 through the corresponding drive circuit 022 for the particular subpixel area. For example, if the light compensation IC determines that the intensity of light emitted by the organic light emitting layer 021 in a particular subpixel area is too low, then the light compensation IC is configured to signal the drive circuit 022 for that particular subpixel area to increase the intensity of light emitted by the organic light emitting layer 021.

However, a common practice during conventional processes for fabricating the display panel is to form the electrode layer of the drive transistor 011 before forming the photodetector. The photodetector 012 itself is formed next, and the source and drain electrodes of the drive transistor 011 are formed last through etching. However, during the etching process, the etching solution may damage the photodetector 012, which may in turn reduce the accuracy and functionality of the photodetector 012 in providing light compensation to the subpixel area. This can negatively affect the display effects of the display panel.

On the other hand, if the source and drain electrodes of the drive transistor 011 are formed first, followed by the photodetector 012, then a substantial amount of hydrogen may be released during the formation of the photodetector 012. The material for forming the photodetector 012 often contains a large amount of hydrogen (in the form of hydrogen ions ($H^+$), hydrogen molecules ($H_2$), and so on). In addition, the dielectric layer often found in the drive transistor 011 also contains hydrogen. As a result, the released hydrogen may spread to the active layer of the drive transistor 011, damaging the drive transistor 011. This can similarly affect the accuracy and functionality of the photodetector 012 in providing light compensation to the subpixel area, as well as the display effects of the display panel.

Figure 2:
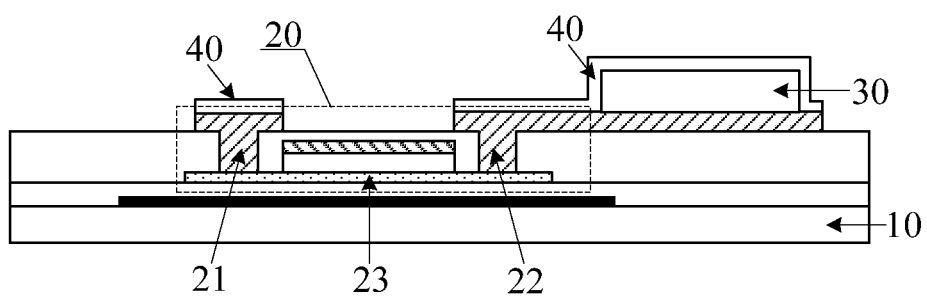
FIGS. 2-3 show schematic diagrams of OLED display substrates according to embodiments of the present disclosure.
Figure 3:
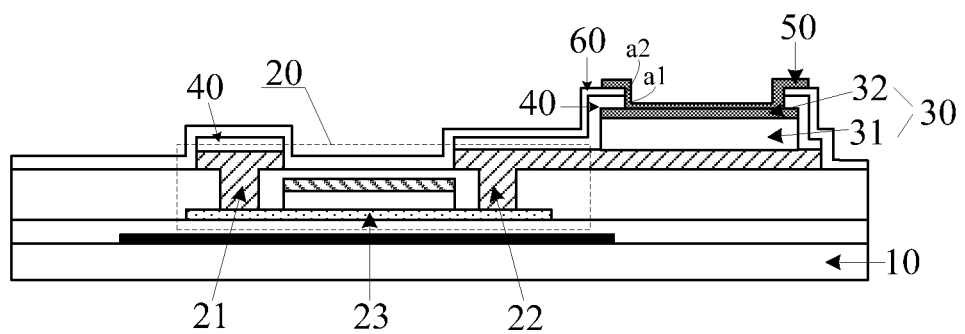

The present disclosure also provides an OLED display substrate. FIGS. 2-3 show schematic diagrams of OLED display substrates according to embodiments of the present disclosure. It is understood that the schematic diagrams of FIGS. 2-3 are not intended to indicate that the display substrate includes only the components shown in those figures. The display substrate according to the present disclosure may include any number of additional accessories and/or components known to a person of ordinary skill in the art, but not shown in FIG. 2 or FIG. 3, depending on the details of the specific implementation.

As shown in FIG. 2, the display substrate includes a first substrate 10. The first substrate 10 is divided into a plurality of subpixel areas. In each of the plurality of subpixel areas is provided a light compensation drive transistor 20 and a photodetector 30.

The drive transistor 20 includes an electrode layer. The electrode layer includes a source electrode 21 and a drain electrode 22. The photodetector 30 is electrically coupled to one of the source electrode 21 and the drain electrode 22. In the embodiments illustrated in the present figures, the photodetector 30 is electrically coupled to the drain electrode 22, but it is understood that the present disclosure is not limited to these embodiments. The photodetector 30 may also be electrically coupled to the source electrode 21. The orthographic projection of the drive transistor 20 on the first substrate 10 is defined so that the orthographic projection is bounded at one end by the edge of the orthographic projection of the source electrode 21 on the first substrate 10, and bounded at the opposite end by the edge of the orthographic projection of the drain electrode 22 on the first substrate 10, for example, as shown in FIGS. 2-5 and 11-14. The orthographic projection of the photodetector 30 on the first substrate 10 overlaps with the orthographic projection of the drive transistor 20 on the first substrate 10. In some embodiments, an entirety of the orthographic projection of the photodetector 30 on the first substrate 10 is inside the orthographic projection of the drive transistor 20 on the first substrate 10.

An insulation layer 40 is provided on the photodetector 30. The insulation layer 40 may include at least one through-hole (for example, through-hole a1 shown in FIG. 3). The orthographic projection of the insulation layer 40 on the first substrate 10 overlaps with the orthographic projection of the electrode layer on the first substrate 10. In some embodiments, an entirety of the orthographic projection of the insulation layer 40 on the first substrate 10 is inside the orthographic projection of the electrode layer on the first substrate 10.

In the display substrate according to the present disclosure, the photodetector is configured to detect the intensity of light emitted through a subpixel area, and to transmit information about the detected light emission intensity to the drive transistor. Based on such information, the drive transistor can determine and apply the appropriate adjustment to the intensity of light emitted through the subpixel area. The present disclosure thus makes it possible to perform real-time light compensations on the display panel even outside the factory setting.

In some embodiments, the insulation layer 40 and the electrode layer may be formed in a single patterning step. That is, the insulation layer 40 and the source electrode 21 and the drain electrode 22 of the drive transistor 20 may be formed in a single patterning step.

By forming the insulation layer 40 of the photodetector 30 and the electrode layer of the drive transistor 20 in a single patterning step, the present disclosure avoids etching to form the electrode layer before forming the photodetector 30, so as to avoid the etching solution from damaging the photodetector 30. The present disclosure also avoids damages to the drive transistor 20 as a result of hydrogen released during formation of the photodetector 30 infiltrating the active layer 23 of the drive transistor 20. The present disclosure thus makes it possible to improve the functionalities of the drive transistor 20, and in turn, the display effects of the display substrate.

Further, since the insulation layer 40 of the photodetector 30 is formed in the same single patterning step as the electrode layer (including the source and drain electrode 21, 22) of the drive transistor 20, the insulation layer 40 can protect the photodetector 30 from the damaging effects of the etching solution during the formation of the source and drain electrodes 21, 22 by etching. This can improve the accuracy and functionality of the photodetector 30 in providing light compensation to the pixel units, and further improve the display effects of the display substrate.

The photodetector 20 is electrically coupled to one of the source electrode 21 and the drain electrode 22 of the drive transistor 20. In some embodiments, the photodetector 30 is electrically coupled to the drain electrode 22. The orthographic projection of the photodetector 30 on the first substrate 10 overlaps with the orthographic projection of the drain electrode 22 on the first substrate 10. In some embodiments, an entirety of the orthographic projection of the photodetector 30 on the first substrate 10 is inside the orthographic projection of the drain electrode 22 on the first substrate 10, for example, as shown in FIG. 2. The drain electrode 22 prevents interferences from ambient light on the photodetector 30, so as to facilitate detection by the photodetector 30 of light emitted from the organic light emitting layer 220 in the subpixel area. This may in turn improve the accuracy of the detection by the photodetector 30. It is understood that the present disclosure is not limited to these embodiments where the photodetector 30 is electrically coupled to the drain electrode 22. The photodetector 30 may also be electrically coupled to the source electrode 21.

When one end of the photodetector 30 is electrically coupled to the drain electrode 22 (or the source electrode 21), the other end of the photodetector 30 may be electrically coupled to a coupling electrode. FIG. 3 shows a schematic diagram of an OLED display substrate according to an embodiment of the present disclosure. As shown in FIG. 3, the display substrate may further include a coupling electrode 50 on the insulation layer 40. The coupling electrode 50 may be electrically coupled to the photodetector 30 through a through-hole a1 in the insulation layer.

When forming the coupling electrode 50, to prevent short-circuiting between the materials for forming the coupling electrode 50, and the source electrode 21 and drain electrode 22 of the drive transistor 20, a passivation layer 60 may be formed on the insulation layer 40 before forming the coupling electrode 50. The passivation layer 60 may include at least one through-hole a2. The coupling electrode 50 may be electrically coupled to the photodetector 30 through the through-hole a1 in the insulation layer and the through-hole a2 in the passivation layer 60.

The through-holes a1, a2 in the insulation layer 40 and the passivation layer 60 are formed by patterning. To prevent the etching solution used during the patterning process from damaging the surface of the photodetector 30, the photodetector 30 according to the present disclosure may further include a semiconductor layer 31 and a protective layer 32. The semiconductor layer 31 and the protective layer 31 are arranged so that the semiconductor layer 31 is between the protective layer 32 and the first substrate 10, for example, as shown in FIG. 3. The orthographic projection of the semiconductor layer 31 on the first substrate 10 overlaps with the orthographic projection of the protective layer 32 on the substrate. In some embodiments, an entirety of the orthographic projection of the semiconductor layer 31 on the first substrate 10 is inside the orthographic projection of the protective layer 32 on the first substrate 10. The coupling electrode 50 may be electrically coupled to the protective layer 32 via the through-hole a1 in the insulation layer 40 and the through-hole a2 in the passivation layer 60. The protective layer 32 makes it possible to prevent damages to the surface of the photodetector 31 during the patterning process, and helps ensure the accuracy and functionality of the photodetector 30 in providing light compensation to the subpixels.

In some embodiments, the semiconductor layer 31 in the photodetector 30 is configured to detect light intensity. To prevent interferences from the protective layer 32 and the coupling electrode 50 on the accuracy of the semiconductor layer 31's light intensity detection, the protective layer 32 and the coupling electrode 50 are each composed of a transparent conductive material. For example, the protective layer 32 and the coupling electrode 50 may be composed of indium tin oxide (ITO), indium-doped zinc oxide (IZO), and the like. The protective layer 32 and the coupling electrode 50 may be composed of the same or different material.

In some embodiments, the semiconductor layer 31 includes a n-type semiconductor layer, an i-type semiconductor layer on the n-type semiconductor layer, and a p-type semiconductor layer on the i-type semiconductor layer. The n-type semiconductor layer is closer to the first substrate 10 than the i-type semiconductor layer or the p-type semiconductor layer.

A display panel typically includes a first panel that forms the cover panel, and a second panel that forms the back panel.

The present disclosure provides a display substrate that may be incorporated into the cover panel. A display panel incorporating the display substrate of the present disclosure in this manner may be a top-emitting display panel, and light from the display panel exits through the cover panel.

Figure 4:
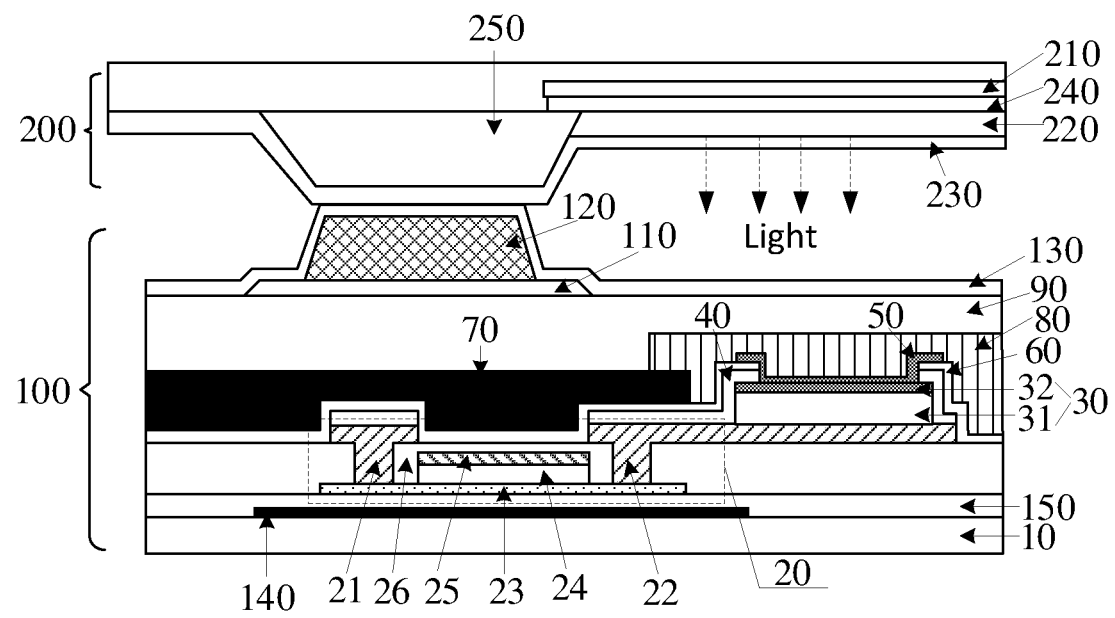
FIGS. 4-5 show schematic diagrams of OLED display panels according to embodiments of the present disclosure.

FIG. 4 shows a schematic diagram of OLED display panel according to an embodiment of the present disclosure. More particularly, FIG. 4 illustrates an embodiment in which the display substrate according to the present disclosure forms the cover panel. It is understood that the schematic diagram of FIG. 4 is not intended to indicate that the display panel includes only the components shown in FIG. 4. The display panel according to the present disclosure may include any number of additional accessories and/or components known to a person of ordinary skill in the art, but not shown in FIG. 4, depending on the details of the specific implementation.

As shown in FIG. 4, the cover panel 100 may include a black matrix layer 70 on the insulation layer 40 (for example, on the coupling electrode 50); a color filter layer 80 on the black matrix layer 70; a first cover layer 90 on the color filter layer 80; a first auxiliary cathode 110 on the first cover layer 90; a support 120 on the first auxiliary cathode 110; and a second auxiliary cathode 130 on the support 120. As shown in FIG. 4, the orthographic projection of the black matrix layer 70 on the first substrate 10 overlaps partially with the orthographic projection of the color filter layer 80 on the first substrate 10. The first cover layer 90 may cover an entirety of the surface of the black matrix layer 70 and the surface of the color filter layer 80.

The black matrix layer 70 may be provided on the drive transistor 20. The color filter layer 80 may be provided on the photodetector 30. The orthographic projection of the black matrix layer 70 on the first substrate 10 may overlap with the orthographic projection of the drive transistor on the first substrate 10. The orthographic projection of the photodetector 30 on the first substrate 10 may overlap with the orthographic projection of the color filter layer 80 on the first substrate 10. In some embodiments, an entirety of the orthographic projection of the photodetector 30 on the first substrate 10 may be inside the orthographic projection of the color filter layer 80 on the first substrate 10.

The first auxiliary cathode 110 is electrically coupled to the second auxiliary cathode 130. The first auxiliary cathode 110 may be composed of a metal. The second auxiliary cathode 130 may be composed of a transparent conductive material. The first auxiliary cathode 110 can effectively reduce the resistance of the second auxiliary cathode 130.

The display panel may further include a back panel 200. The back panel 200 includes a second substrate, a drive circuit 210, an anode 240, a pixel defining layer 250, an organic light emitting layer 220, and a cathode 230 arranged in this order in a direction toward the cover panel 100. The organic light emitting layer 210 in each subpixel area is configured to be controlled by the drive circuit 210, and to emit light toward the cover panel 100. The light emitted by the organic light emitting layer 210 travels through the second auxiliary cathode 130 and the photodetector 30 in the cover panel 100. The anode 240 may be composed of a reflective metallic material. The cathode 230 may be composed of a transparent conductive material.

When the cover panel 100 and the back panel 200 are assembled, the cathode 230 on the back panel 200 is in contact with the second auxiliary cathode 130 on the cover panel 100, for example, as shown in FIG. 4. The second auxiliary cathode 130 can effectively reduce the resistance of the cathode 230.

The present disclosure also provides a display substrate that may be incorporated into the back panel. The display panel incorporating the display substrate of the present disclosure in this manner may be a bottom-emitting display panel, and light from the display panel exits in a direction away from the cover panel.

Figure 5:
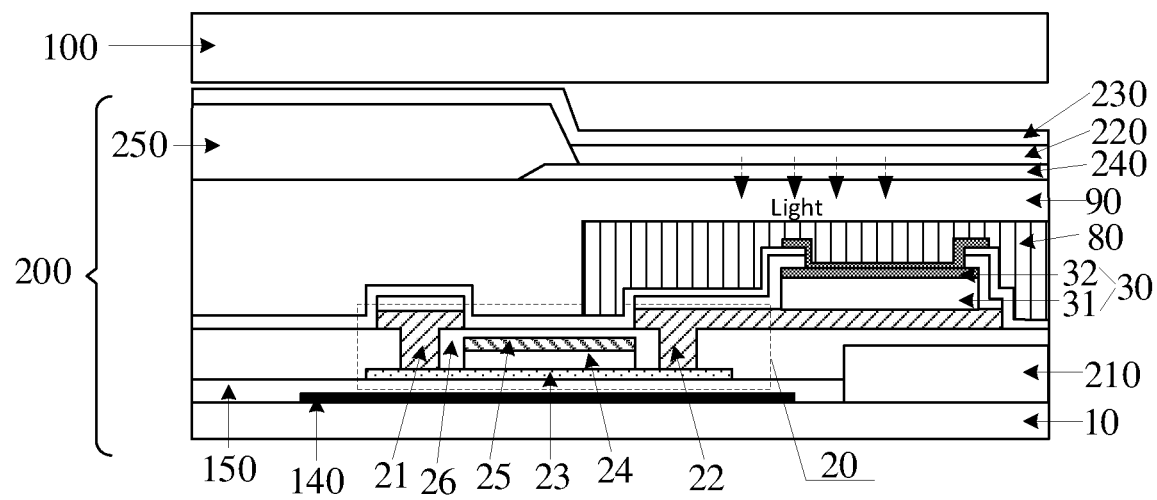

FIG. 5 shows a schematic diagram of OLED display panel according to an embodiment of the present disclosure. More particularly, FIG. 5 illustrates an embodiment in which the display substrate according to the present disclosure forms the back panel. It is understood that the schematic diagram of FIG. 5 is not intended to indicate that the display panel includes only the components shown in FIG. 5. The display panel according to the present disclosure may include any number of additional accessories and/or components known to a person of ordinary skill in the art, but not shown in FIG. 5, depending on the details of the specific implementation.

The back panel 200 includes the photodetector 30 and the drive transistor 20. The display panel further includes the cover panel 100. The cover panel 100 may be formed of any suitable material known to a person of ordinary skill in the art, including, but not limited to, glass.

As shown in FIG. 5, the back panel 200 (that is, the display substrate according to the present disclosure) includes the drive circuit 210 on the first substrate 10; the color filter layer 80 on the insulation layer 40 (for example, on the coupling electrode 50); the first cover layer 90 on the color filter layer 80; the anode 240 on the first cover layer 90; the pixel defining layer 250 on the anode 240; the organic light emitting layer 220 on the pixel defining layer 250; and the cathode 230 on the organic light emitting layer 220.

The anode 240 is electrically coupled to the drive circuit 210. The drive circuit 210 is configured to drive the organic light emitting layer 220 to emit light toward the first substrate 10. The color filter layer 80 may be provided on the photodetector 30. The anode 240 and the organic light emitting layer 220 may be provided on the color filter layer 80. The orthographic projection of the photodetector 30 on the first substrate 10 may overlap with the orthographic projection of the color filter layer 80 on the first substrate 10. In some embodiments, an entirety of the orthographic projection of the photodetector 30 on the first substrate 10 may be inside the orthographic projection of the color filter layer 80 on the first substrate 10. The anode 240 may be composed of a transparent conductive material. The cathode 230 may be composed of a reflective metallic material.

Each of FIG. 4 and FIG. 5 shows one subpixel area. The color filter layers 80 in different subpixel areas may be configured differently. More particularly, the color filter layer 80 in one subpixel area may be a red filter layer, and the color filter layers 80 in pixel units on either side of the subpixel area may be a green filter layer and a blue filter layer, respectively. However, the present disclosure does not particularly limit the order in which the subpixels with different color filter layers are arranged. Subpixels with different color filter layers may be arranged in any appropriate manner known to a person of ordinary skill in the art.

As shown in FIGS. 4 and 5, the drive transistor 20 may include an active layer 23 on the first substrate 10; a gate insulation layer 24 on the active layer 24; a gate electrode 25 on the gate insulation layer 24; a dielectric layer 26 on the gate electrode 25; and the electrode layer (including the source electrode 21 and the drain electrode 22) on the dielectric layer 26.

In some embodiments, the dielectric layer 26 is formed with at least one through-hole. The through-hole is configured to allow electrical coupling between the active layer and the source and drain electrodes.

The display substrate according to the present disclosure (for example, in the cover panel illustrated in FIG. 4 or in the back panel 200 illustrated in FIG. 5) may further include a light shielding layer 140 on the first substrate 10, a buffer layer 150 on the light shielding layer 140. The drive transistor 20 may be provided on the buffer layer 150. The orthographic projection of the active layer 23 on the first substrate 10 overlaps with the orthographic projection of the light shielding layer 140 on the first substrate 10. In some embodiments, an entirety of the orthographic projection of the active layer 23 on the first substrate 10 may be inside the orthographic projection of the light shielding layer 140 on the first substrate 10. The light shielding layer 140 may prevent interferences from ambient light on the active layer 23, which may in turn prevent the occurrence of threshold voltage drift in the drive transistor 20.

The structure and configuration of the drive transistor 20 are not particularly limited. The drive transistor 20 may be configured in any appropriate manner known to a person of ordinary skill in the art. The present disclosure describes embodiments in which the drive transistor 20 is a top-gate type TFT (for example, a top-gate type TFT having a self-aligned structure), but the present disclosure does not limit the drive transistor 20 to a top-gate type TFT. The drive transistor 20 may be a bottom-gate type TFT (for example, an etch stop layer (ESL)-type TFT, a back channel etch (BCE)-type TFT, and the like).

In the display substrate according to the present disclosure, each pixel unit is provided with a light compensation drive transistor and a photodetector. The photodetector is electrically coupled to one of the source electrode and the drain electrode in the drive transistor. The photodetector is configured to detect the intensity of light emitted by the pixel unit, and to transmit the detected intensity to the drive transistor. Based on the received light intensity information, the drive transistor can determine and apply the appropriate adjustment to the intensity of light emitted by the pixel unit. The present disclosure thus makes it possible to perform real-time light compensations on the pixel units in the display panel even outside the factory setting.

Further, in the display substrate according to the present disclosure, an insulation layer is provided on the photodetector, and the insulation layer is formed in the same patterning step as the source electrode and drain electrode of the drive transistor. This can prevent damages to the photodetector during the patterning of the source and drain electrodes. The present disclosure thus makes it possible to improve the accuracy and functionality of the photodetector in providing real-time light compensation to the pixel unit, and further improve the display effects of the OLED display substrate.

By forming the insulation layer of the photodetector 30 and the electrode layer of the drive transistor in a single patterning step, the present disclosure avoids etching to form the electrode layer before forming the photodetector, so as to avoid the etching solution from damaging the photodetector. The present disclosure also avoids damages to the drive transistor as a result of hydrogen released during formation of the photodetector infiltrating the drive transistor 20. The present disclosure thus makes it possible to improve the functionalities of the drive transistor, and in turn, the display effects of the OLED display substrate.

Figure 6:
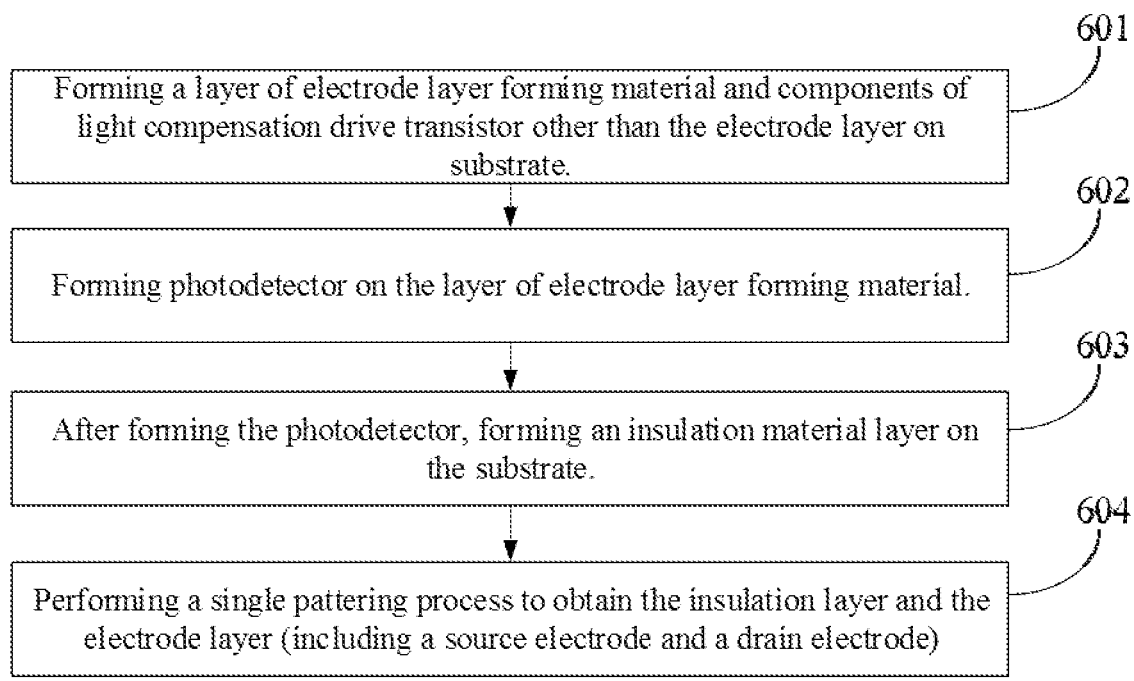
FIGS. 6-7 show flow charts of methods of fabricating OLED display substrates according to embodiments of the present disclosure.
Figure 7:
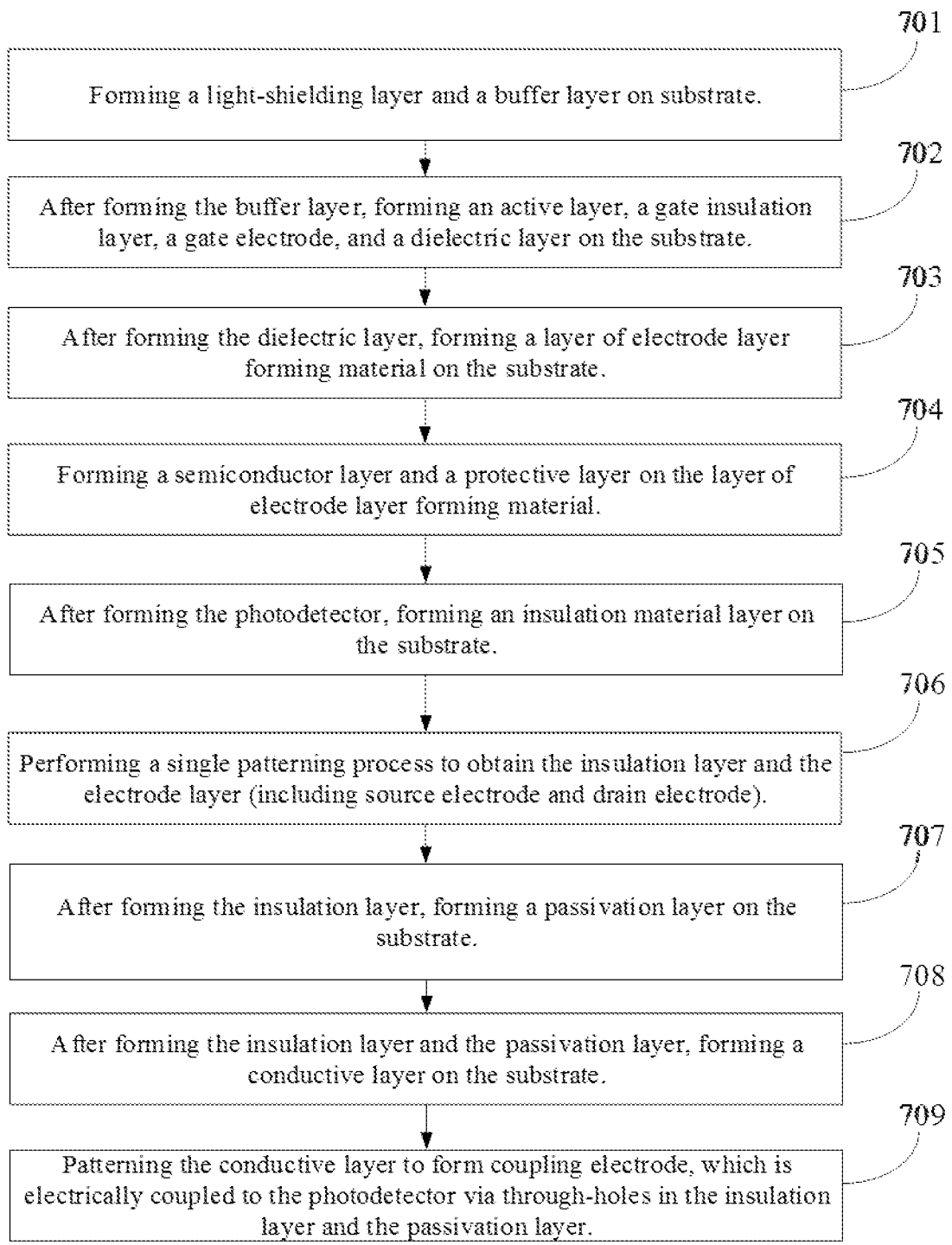

The present disclosure also provides a method of fabricating an OLED display substrate. FIGS. 6-7 show flow charts of methods of fabricating OLED display substrates according to embodiments of the present disclosure.

The display substrate includes a substrate. The substrate is divided into a plurality of subpixel areas. A light compensation drive transistor and a photodetector are formed in subpixel area on the substrate. An insulation layer is formed on the photodetector.

The drive transistor includes an electrode layer that includes a source electrode and a drain electrode. The photodetector is electrically coupled to one of the source electrode and the drain electrode. In each subpixel area, the orthographic projection of the insulation layer on the substrate overlaps with the orthographic projection of the electrode layer on the substrate. In some embodiments, an entirety of the orthographic projection of the insulation layer on the substrate is inside the orthographic projection of the electrode layer on the substrate.

As shown in FIG. 6, in step 601, components of the light compensation drive transistor other than the electrode layer are formed on the substrate. A layer of electrode layer forming material is also formed on the substrate.

In step 602, the photodetector is formed on the layer of electrode layer forming material.

In step 603, after forming the photodetector, an insulation material layer is formed on the substrate.

In step 604, a single patterning process is performed on the insulation material layer and the layer of electrode layer forming material, to obtain the insulation layer and the electrode layer (including the source electrode and the drain electrode).

For convenience and simplicity, the descriptions above refer to only a single subpixel area. However, it is understood that the substrate is divided into a plurality of subpixel areas, and that the features of the display substrate described above are formed in each of the plurality of subpixel areas.

In the display substrate according to the present disclosure, in each subpixel area is provided a light compensation drive transistor and a photodetector. The photodetector is electrically coupled to one of the source electrode and the drain electrode in the drive transistor. The photodetector is configured to detect the intensity of light emitted through a subpixel area, and to transmit the detected intensity to the drive transistor. Based on the received light intensity information, the drive transistor can determine and apply the appropriate adjustment to the intensity of light emitted through the subpixel area. The present disclosure thus makes it possible to perform real-time light compensations on the display panel even outside the factory setting.

Further, in the display substrate according to the present disclosure, an insulation layer is provided on the photodetector, and the insulation layer is formed in the same patterning step as the source electrode and drain electrode of the drive transistor. This can prevent damages to the photodetector when patterning the source and drain electrodes. The present disclosure thus makes it possible to improve the accuracy and functionality of the photodetector in providing real-time light compensation, and further improve the display effects of the display substrate.

By forming the insulation layer of the photodetector 30 and the electrode layer of the drive transistor in a single patterning step, the present disclosure avoids etching to form the electrode layer before forming the photodetector, so as to avoid the etching solution from damaging the photodetector. The present disclosure also avoids damages to the drive transistor as a result of hydrogen released during formation of the photodetector infiltrating the drive transistor 20. The present disclosure thus makes it possible to improve the functionalities of the drive transistor, and in turn, the display effects of the display substrate.

FIG. 7 shows a flow chart of a method of fabricating the OLED display substrate illustrated in FIG. 3.

In step 701, a light-shielding layer and a buffer layer are formed on the substrate.

The light-shielding layer may be composed of any suitable metallic material known to a person of ordinary skill in the art, including molybdenum (Mo), copper (Cu), aluminum (Al), and the like, or an alloy of such metals.

The buffer layer may be composed of any suitable insulating material known to a person of ordinary skill in the art, including silicon monoxide, silicon nitride, silicon-oxy-nitride, and the like.

A light-shielding material layer is formed on the substrate. The light-shielding material layer may be formed by any appropriate means known to a person of ordinary skill in the art, including, but not limited to, deposition, coating, and sputtering. The light-shielding material layer is then patterned in a single patterning step to form the light-shielding layer. The patterning process may include coating to form a photoresist layer, exposing, developing, and etching to form the desired pattern, and finally stripping the photoresist.

The buffer layer may be formed by any appropriate means known to a person of ordinary skill in the art, including, but not limited to, deposition, coating, and sputtering.

In step 702, after forming the buffer layer, an active layer, a gate insulation layer, a gate electrode, and a dielectric layer are formed on the substrate.

The active layer may be composed of any suitable metal oxide material known to a person of ordinary skill in the art, including indium tin oxide (ITO), indium gallium zinc oxide (IGZO), indium-doped zinc oxide (IZO), and the like. The active layer may also be composed of any suitable inorganic material known to a person of ordinary skill in the art, including polycrystalline silicon, amorphous silicon, and the like.

The gate insulation layer may be composed of any suitable insulating material known to a person of ordinary skill in the art, including silicon monoxide, silicon nitride, silicon-oxy-nitride, and the like.

The gate electrode may be composed of any suitable metallic material known to a person of ordinary skill in the art, including molybdenum (Mo), copper (Cu), aluminum (Al), and the like, or an alloy of such metals.

The dielectric layer may be composed of any suitable material known to a person of ordinary skill in the art, including, but not limited to, silicon dioxide, silicon nitride, and a material having a high dielectric constant.

A layer of active layer forming material is formed on the buffer layer. The layer of active layer forming material may be formed by any appropriate means known to a person of ordinary skill in the art, including, but not limited to, deposition, coating, and sputtering. The layer of active layer forming material is then patterned in a single patterning step to form the active layer. The patterning process may include coating to form a photoresist layer, exposing, developing, and etching to form the desired pattern, and finally stripping the photoresist.

After forming the active layer, a layer of gate insulation material and a layer of gate electrode forming material are formed on the buffer layer. The gate insulation material and gate electrode forming material may be applied to the substrate by any appropriate means known to a person of ordinary skill in the art, including, but not limited to, deposition, coating, and sputtering. The layer of gate insulation material and a layer of gate electrode forming material are then patterned in a single patterning step to form the gate electrode and the gate insulation layer. The patterning process may include coating to form a photoresist layer, exposing, developing, and etching to form the desired pattern, and finally stripping the photoresist.

After forming the gate electrode, a layer of dielectric material is formed on the substrate. The dielectric material may be applied to the substrate by any appropriate means known to a person of ordinary skill in the art, including, but not limited to, deposition, coating, and sputtering. The layer of dielectric material is then patterned in a single patterning step form the dielectric layer. The patterning process may include coating to form a photoresist layer, exposing, developing, and etching to form the desired pattern, and finally stripping the photoresist. In some embodiments, the dielectric layer 26 is formed with at least one through-hole. The through-hole is configured to allow electrical coupling between the active layer and the source and drain electrodes.

In step 703, after forming the dielectric layer, a layer of electrode layer forming material is formed on the substrate. The electrode layer forming material may be any suitable metallic material known to a person of ordinary skill in the art, including molybdenum (Mo), copper (Cu), aluminum (Al), and the like, or an alloy of such metals.

Figure 8:
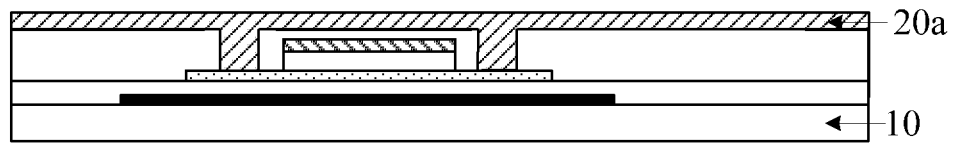
FIG. 8 shows a schematic diagram of the formation of a layer of electrode layer forming material according to an embodiment of the present disclosure.

FIG. 8 shows a schematic diagram of the formation of a layer of electrode layer forming material according to an embodiment of the present disclosure. As shown in FIG. 8, the layer of electrode layer forming material 20a is formed on the first substrate 10. The layer of electrode layer forming material 20a may be applied to the substrate by any appropriate means known to a person of ordinary skill in the art, including, but not limited to, deposition, coating, and sputtering.

In step 704, a semiconductor layer and a protective layer is formed on the layer of electrode layer forming material.

The semiconductor layer may include a n-type semiconductor layer, an i-type semiconductor layer on the n-type semiconductor layer, and a p-type semiconductor layer on the i-type semiconductor layer. The n-type semiconductor layer is closer to the first substrate 10 than the i-type semiconductor layer or the p-type semiconductor layer. The component layers of the semiconductor layer may be prepared and formed in any appropriate manner known to a person of ordinary skill in the art.

The protective layer may be composed of a transparent conductive material, including ITO, IZO, and the like.

Figure 9:
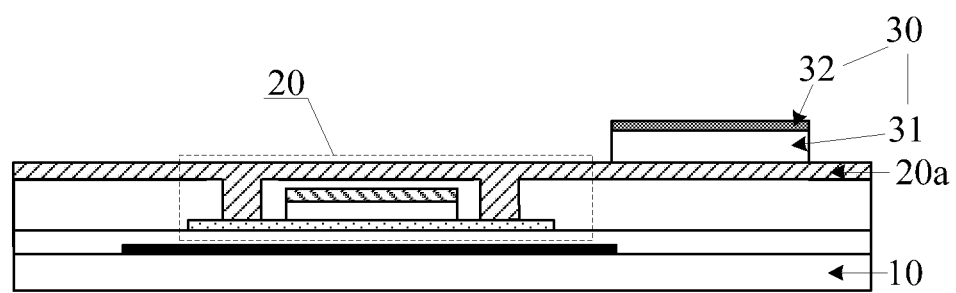
FIG. 9 shows a schematic diagram of the formation of a semiconductor layer and a protective layer according to an embodiment of the present disclosure.

FIG. 9 shows a schematic diagram of the formation of a semiconductor layer and a protective layer according to an embodiment of the present disclosure.

In some embodiments, the materials for forming the n-type semiconductor layer, i-type semiconductor layer, and p-type semiconductor layer, and the material for forming the protective layer, may be deposited on the layer of electrode layer forming material by plasma enhanced chemical vapor deposition (PECVD). These forming materials are then patterned in a single patterning process to form the protective layer 32 and the semiconductor layer 31. The patterning process may include coating to form a photoresist layer, exposing, developing, and etching to form the desired pattern, and finally stripping the photoresist. The protective layer 32 and the semiconductor layer 31 constitute the photodetector 30.

To etch the protective layer during the patterning process, wet etching may be used. To etch the component layers of the semiconductor layer, dry etching may be used. This makes it possible to increase the etching efficiency, and in turn, the efficiency of the display substrate production.

In step 705, after forming the photodetector, an insulation material layer is formed on the substrate.

The insulation material may be any suitable insulating material known to a person of ordinary skill in the art, including silicon monoxide, silicon nitride, silicon-oxynitride, and the like.

Figure 10:
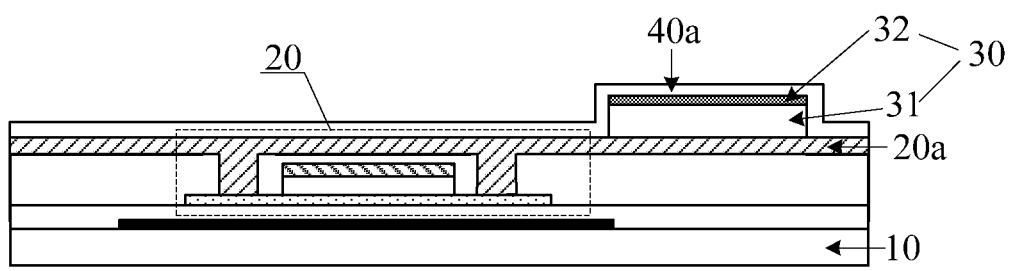
FIG. 10 shows a schematic diagram of the formation of an insulation layer according to an embodiment of the present disclosure.

FIG. 10 shows a schematic diagram of the formation of an insulation layer according to an embodiment of the present disclosure. As shown in FIG. 10, the insulation material layer 40*a* may be applied to the substrate, on which the photodetector 30 has already been formed, by any appropriate means known to a person of ordinary skill in the art, including, but not limited to, deposition, coating, and sputtering.

In step 706, a single patterning process is performed on the insulation material layer and the layer of electrode layer forming material to obtain the insulation layer and the electrode layer.

Figure 11:
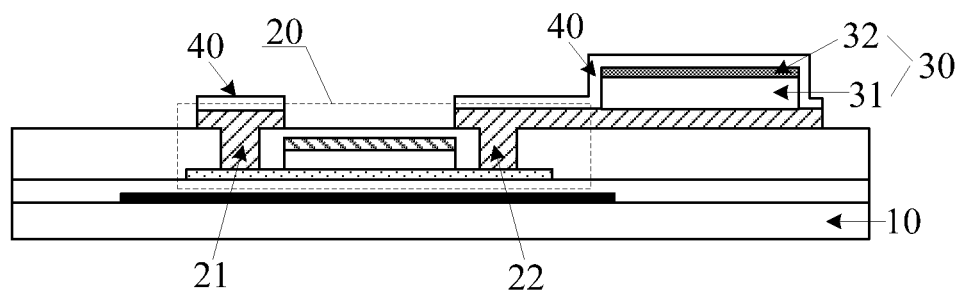
FIG. 11 shows a schematic diagram of the formation of an electrode layer and an insulation layer according to an embodiment of the present disclosure.

FIG. 11 shows a schematic diagram of the formation of an electrode layer and an insulation layer according to an embodiment of the present disclosure. As shown in FIG. 11, a single patterning process is performed on the insulation material layer and the layer of electrode layer forming material to obtain the insulation layer and the electrode layer (including the source electrode 21 and the drain source 22). The patterning process may include coating to form a photoresist layer, exposing, developing, and etching to form the desired pattern, and finally stripping the photoresist. Once the electrode layer is formed, the drive transistor 20 is obtained.

In step 707, after forming the insulation layer, a passivation layer is formed on the substrate. The passivation layer and the insulation layer are then patterned to form through-holes in each of the passivation layer and the insulation layer.

The passivation layer may be composed of any suitable material known to a person of ordinary skill in the art, including silicon monoxide, silicon nitride, silicon-oxynitride, and the like.

Figure 12:
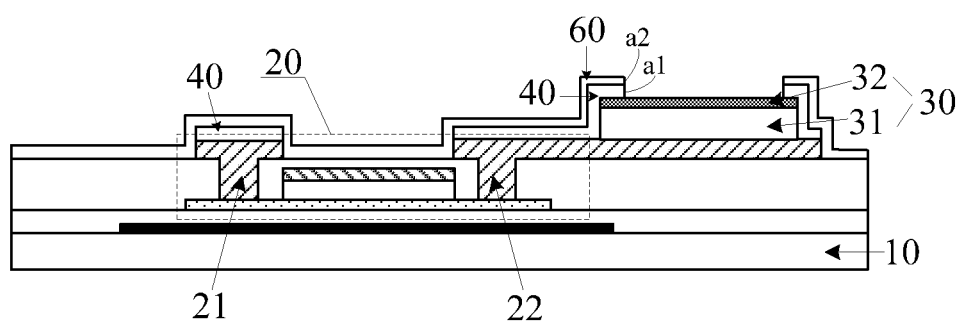
FIG. 12 shows a schematic diagram of the formation of a passivation layer according to an embodiment of the present disclosure, including the formation of a through-hole in the passivation layer.

FIG. 12 shows a schematic diagram of the formation of a passivation layer according to an embodiment of the present disclosure, including the formation of a through-hole in the passivation layer.

As shown in FIG. 12, a layer of passivation layer forming material may be applied to the first substrate 10 by any appropriate means known to a person of ordinary skill in the art, including, but not limited to, deposition, coating, and sputtering, to form the passivation layer 60. The insulation layer 40 has already been formed on the first substrate 10. A single patterning process is then performed on the passivation layer 60 and the insulation layer 40 to form at least one through-hole a2 in the passivation layer and at least one through-hole a1 in the insulation layer 40. The photodetector 30 is electrically coupled via the through-holes a1, a2.

In step 708, after forming the insulation layer and the passivation layer, a conductive layer is formed on the substrate. The conductive layer is electrically coupled to the photodetector 30 via the through-holes in the insulation layer and the passivation layer.

The conductive layer may be composed of any suitable transparent conductive material known to a person of ordinary skill in the art, including ITO, IZO, and the like.

Figure 13:
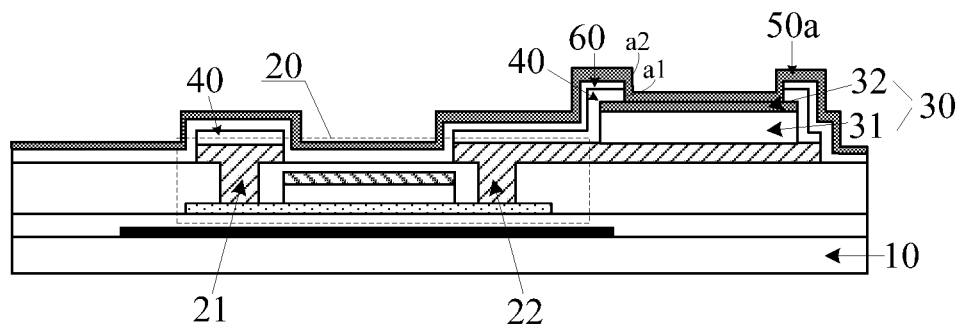
FIG. 13 shows a schematic diagram of the formation of a conductive layer according to an embodiment of the present disclosure.

FIG. 13 shows a schematic diagram of the formation of a conductive layer according to an embodiment of the present disclosure. As shown in FIG. 13, a layer of conductive layer forming material 50*a* is formed on the substrate. The conductive layer forming material 50*a* may be applied to the substrate by any appropriate means known to a person of ordinary skill in the art, including, but not limited to, deposition, coating, and sputtering, to form the conductive layer 50*a*. The conductive layer 50*a* is electrically coupled to the photodetector 30 via the through-holes a1, a2 in the insulation layer 40 and the passivation layer 60.

In step 709, the conductive layer 50*a* is patterned to form the coupling electrode that is electrically coupled to the photodetector via the through-holes in the insulation layer and the passivation layer.

Figure 14:
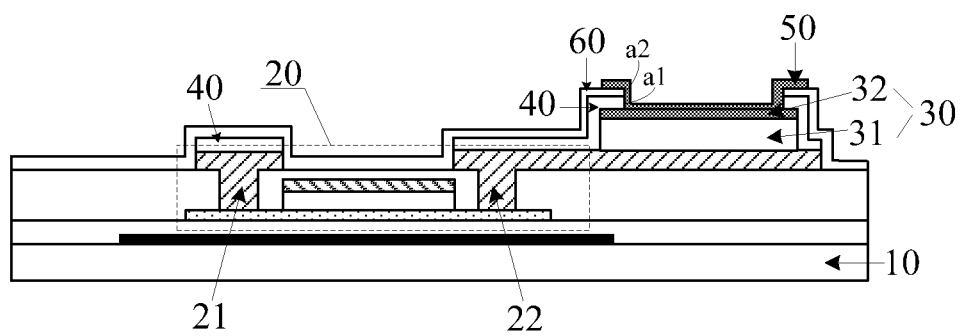
FIG. 14 shows a schematic diagram of the formation of a coupling electrode according to an embodiment of the present disclosure.

FIG. 14 shows a schematic diagram of the formation of a coupling electrode according to an embodiment of the present disclosure. As shown in FIG. 14, a single patterning process may be performed on the conductive layer to form the coupling electrode 50, which is electrically coupled to the photodetector 30 via the through-holes a1, a2 in the insulation layer 40 and the passivation layer 60.

Steps 701 to 709 described above may be used to form the drive transistor and photodetector in a display substrate according to the present disclosure. Further, as described above, a display panel according to the present disclosure may be incorporated into the cover panel or the back panel of a display, for example, as shown in FIGS. 4 and 5. Since cover panel and back panel may have different structures, it is therefore understood that depending on the specific implementation of the display substrate of the present disclosure, the display substrate may be subject to processing in addition to steps 701 to 709 described above.

In embodiments where the display substrate of the present disclosure is incorporated into a cover panel, for example, as illustrated in FIG. 4, the method of fabricating the display substrate may further include the following step after step 709.

After forming the coupling electrode, a black matrix, a color filter layer, a first cover layer, a first auxiliary cathode, a support, and a second auxiliary cathode are formed on the substrate. The processes for forming these components are not particularly limited, and these components may be formed according to any appropriate process known to a person of ordinary skill in the art.

In embodiments where the display substrate of the present disclosure is incorporated into a back panel, for example, as illustrated in FIG. 5, the method of fabricating the display substrate may further include the following step after step 709.

After forming the coupling electrode, a color filter, a first cover layer, an anode, a pixel defining layer, an organic light emitting layer, and a cathode are formed on the substrate. The processes for forming these components are not particularly limited, and these components may be formed according to any appropriate process known to a person of ordinary skill in the art.

In addition, in step 702, during which the active layer, the gate insulation layer, the gate electrode, and the dielectric layer are formed, a drive circuit may also be formed on the substrate. The structure and configuration of the drive circuit are not particularly limited. The drive circuit may be structured and configured in any appropriate manner known to a person of ordinary skill in the art.

In the display substrate according to the present disclosure, in each subpixel area is provided a light compensation drive transistor and a photodetector. The photodetector is electrically coupled to one of the source electrode and the drain electrode in the drive transistor. The photodetector is configured to detect the intensity of light emitted through the subpixel area, and to transmit the detected intensity to the drive transistor. Based on the received light intensity information, the drive transistor can determine and apply the appropriate adjustment to the intensity of light emitted through the subpixel area. The present disclosure thus makes it possible to perform real-time light compensations on the display panel even outside the factory setting.

Further, in the display substrate according to the present disclosure, an insulation layer is provided on the photodetector, and the insulation layer is formed in the same patterning step as the source electrode and drain electrode of the drive transistor. This can prevent damages to the photodetector during the patterning of the source and drain electrodes. The present disclosure thus makes it possible to improve the accuracy and functionality of the photodetector in providing real-time light compensation to the pixel unit, and further improve the display effects of the display substrate.

By forming the insulation layer of the photodetector 30 and the electrode layer of the drive transistor in a single patterning step, the present disclosure avoids etching to form the electrode layer before forming the photodetector, so as to avoid the etching solution from damaging the photodetector. The present disclosure also avoids damages to the drive transistor as a result of hydrogen released during formation of the photodetector infiltrating the drive transistor 20. The present disclosure thus makes it possible to improve the functionalities of the drive transistor, and in turn, the display effects of the display substrate.

The present disclosure also provides a display panel. The display panel includes a display substrate as described above.

In some embodiments, a display panel according to the present disclosure may include the display substrate in the cover panel. Such a display panel may be a top-emitting display panel, and light from the display panel exits through the cover panel. The drive transistor and the photodetector may be provided in the cover panel, for example, as shown in FIG. 4.

In some embodiments, a display panel according to the present disclosure may include the display substrate in a back panel. Such a display panel may be a bottom-emitting display panel, and light from the display panel exits in a direction away from the cover panel. The drive transistor and the photodetector may be provided in the back panel, for example, as shown in FIG. 5.

The present disclosure also provides a display device. The display device includes a display panel as described above. The display device may be any device known to a person of ordinary skill in the art, including, but not limited to, a mobile phone, a tablet, a television, a computer, a display, a notebook computer, a digital photo frame, a navigation system, and any other products or components that provide a display function.

In addition, it is understood that the display device according to the present disclosure may include any other suitable, additional components and/or accessories known to a person of ordinary skill in the art without departing from the spirit and scope of the present disclosure. In some embodiments, the display device may include a light compensation integrated circuit (IC). The light compensation IC may be electrically coupled to the drive transistor and photodetector in the display device. For example, the light compensation IC may be electrically coupled to the photodetector via the coupling electrode.

It is also understood that the methods and techniques described above may be implemented using hardware, and may therefore include hardware elements that may be configured as processors, functional blocks, and the like. This may include implementation in hardware as an application specific integrated circuit or other logic device formed using one or more semiconductors. Hardware elements are not limited by the materials from which they are formed or the processing mechanisms employed therein. Processors may contain semiconductor and/or transistors (for example, electronic integrated circuits). These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

References in the present disclosure made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples. In addition, for a person of ordinary skill in the art, the disclosure relates to the scope of the present disclosure, and the technical scheme is not limited to the specific combination of the technical features, and also should cover other technical schemes which are formed by combining the technical features or the equivalent features of the technical features without departing from the inventive concept. What is more, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:
1. A display substrate, comprising:
   a substrate that is divided into a plurality of subpixel areas,
   a drive transistor and a photodetector in each of the plurality of subpixel areas, and
   an insulation layer on the photodetector, wherein:
the drive transistor comprises an electrode layer comprising a source electrode and a drain electrode,
the photodetector is coupled to one of the source electrode and the drain electrode, and
an entirety of an orthographic projection of the insulation layer on the substrate is within an orthographic projection of the electrode layer on the substrate.

2. A display panel, comprising:
a cover panel, and
a back panel,
wherein one of the cover panel and the back panel comprises the display substrate according to claim 1.

3. The display panel according to claim 2, wherein:
the cover panel comprises the display substrate, a black matrix layer on the drive transistor of the display substrate, a color filter layer on the photodetector of the display substrate, a support on the black matrix layer, and a second auxiliary cathode on the support,
the back panel comprises an anode, an organic light emitting layer on the anode, and a cathode on the organic light emitting layer, and
the cathode of the back panel is joined to the second auxiliary cathode of the cover panel, so as to join the back panel to the cover panel.

4. The display panel according to claim 3, wherein an entirety of an orthographic projection of the photodetector on the substrate is inside an orthographic projection of the color filter layer on the substrate.

5. The display panel according to claim 3, wherein:
the cover panel further comprises a first auxiliary cathode between the black matrix layer and the support,
the first auxiliary cathode is electrically coupled to the second auxiliary cathode,
the first auxiliary cathode is composed of a metal, and
the second auxiliary cathode is composed of a transparent conductive material.

6. The display panel according to claim 3, wherein the cathode of the back panel is composed of a same or different transparent conductive material from the second auxiliary cathode.

7. The display panel according to claim 2, wherein:
the back panel comprises the display substrate, a color filter layer on the display substrate, an anode and an organic light emitting on the color filter layer, and a cathode on the organic light emitting layer, and
the cathode joins the back panel to the cover panel.

8. The display panel according to claim 7, wherein an entirety of an orthographic projection of the photodetector on the substrate is inside an orthographic projection of the color filter layer on the substrate.

9. The display panel according to claim 7, wherein:
the anode is composed of a transparent conductive material, and
the cathode is composed of a reflective metal.

10. A display device, comprising the display panel according to claim 2.

11. The display substrate according to claim 1, wherein:
the insulation layer comprises at least one first through-hole,
the display substrate further comprises a coupling electrode on the insulation layer, the coupling electrode being configured to couple the photodetector to an external circuit, and
the coupling electrode is coupled to the photodetector via the at least one first through-hole.

12. The display substrate according to claim 11, wherein:
the display substrate further comprises a passivation layer between the insulation layer and the coupling electrode,
the passivation layer comprises at least one second through-hole, and
the coupling electrode is coupled to the photodetector via the at least one first through-hole and the at least one second through-hole.

13. The display substrate according to claim 11, wherein each of the coupling electrode and the protective layer is composed of a transparent conductive material.

14. The display substrate according to claim 1, wherein
the insulation layer is in contact with each of the photodetector, the source electrode, and the drain electrode, and
the insulation layer covers an entirety of a surface of the source electrode opposite from the substrate, and an entirety of a surface of the drain electrode opposite from the substrate.

15. The display substrate according to claim 1, wherein:
the photodetector comprises a semiconductor layer on the substrate, and a protective layer on the semiconductor layer, and
an entirety of the orthographic projection of the semiconductor layer on the substrate is inside the orthographic projection of the protective layer on the substrate.

16. A method of fabricating a display substrate, the method comprising:
forming a layer of electrode layer forming material on a substrate,
forming a photodetector on the electrode forming layer,
forming a layer of insulation layer forming material on the photodetector and the layer of electrode layer forming material, and
performing a single patterning step to obtain an insulation layer and an electrode layer comprising a source electrode and a drain electrode,
wherein an entirety of an orthographic projection of the insulation layer on the substrate is inside an orthographic projection of the electrode layer on the substrate.

17. The method according to claim 16, further comprising, before the forming of the layer of electrode layer forming material:
forming a light-shielding layer on the substrate,
forming a buffer layer on the light-shielding layer, and
forming an active layer on the buffer layer, a gate insulation layer on the active layer, a gate electrode on the gate insulation layer, and a dielectric layer on the gate electrode,
wherein an entirety of an orthographic projection of the active layer on the substrate is inside an orthographic projection of the light shielding layer on the substrate.

18. The method according to claim 17, wherein the layer of electrode layer forming material is formed on the dielectric layer.

19. The method according to claim 16, wherein the forming of the photodetector comprises forming a semiconductor layer and a protective layer on the layer of electrode layer forming material.

20. The method according to claim 16, further comprising forming a passivation layer on the insulation layer,
wherein each of insulation layer and the passivation layer is formed with at least one through-hole.

* * * * *